United States Patent [19]

McNair

[11] Patent Number: 4,990,804

[45] Date of Patent: Feb. 5, 1991

[54] SELF-LUMINOUS LIGHT SOURCE

[76] Inventor: Rhett C. McNair, 4081 G E. LaPalma, Anaheim, Calif. 92807

[21] Appl. No.: 419,389

[22] Filed: Oct. 10, 1989

[51] Int. Cl.[5] .......... H01L 31/04; F21K 2/00

[52] U.S. Cl. .......... 250/493.1; 250/458.1; 250/461.1; 250/462.1; 250/486.1

[58] Field of Search .......... 250/493.1, 462.1, 486.1, 250/472.1, 473.1, 485.1

[56] References Cited

U.S. PATENT DOCUMENTS

| | | | |
|---|---|---|---|
| 2,749,251 | 6/1956 | Shapiro | 250/462.1 |
| 3,238,139 | 3/1966 | Fischer et al. | 250/462.1 |
| 3,409,770 | 11/1968 | Clapham, Jr. | 250/462.1 |
| 3,478,209 | 11/1969 | Feuer | 250/462.1 |
| 3,889,124 | 6/1975 | Yamamoto et al. | 250/462.1 |
| 4,016,450 | 4/1977 | Balekjian | 250/462.1 |
| 4,126,384 | 11/1978 | Goodman et al. | 250/462.1 |
| 4,213,052 | 7/1980 | Caffarella et al. | 250/493.1 |
| 4,488,047 | 12/1984 | Thomas | 250/486.1 |
| 4,715,687 | 12/1987 | Glass et al. | 250/462.1 |
| 4,788,437 | 11/1988 | Urquhart et al. | 250/486.1 |

*Primary Examiner*—Jack I. Berman
*Assistant Examiner*—Kiet T. Nguyen
*Attorney, Agent, or Firm*—Plante, Strauss, Vanderburgh & Connors

[57] ABSTRACT

There is disclosed a self-luminous source of light preferably as applied to illuminated signs and safety markers which emits a high level of uniform light. The invention utilizes a beta emitter, preferably tritium gas, which is contained within a sealed glass enclosure having an interior coating of a phosphor. The glass enclosure is contained within an outer enclosure formed of a plastic filled with a fluorescent dye. The phosphor coating on the glass enclosure of the tritium gas absorbs beta radiation from the tritium and emits radiation in a wavelength approximately 360 nanometers which excites the fluorescent dye in the plastic outer enclosure.

17 Claims, 3 Drawing Sheets

FIGURE 1
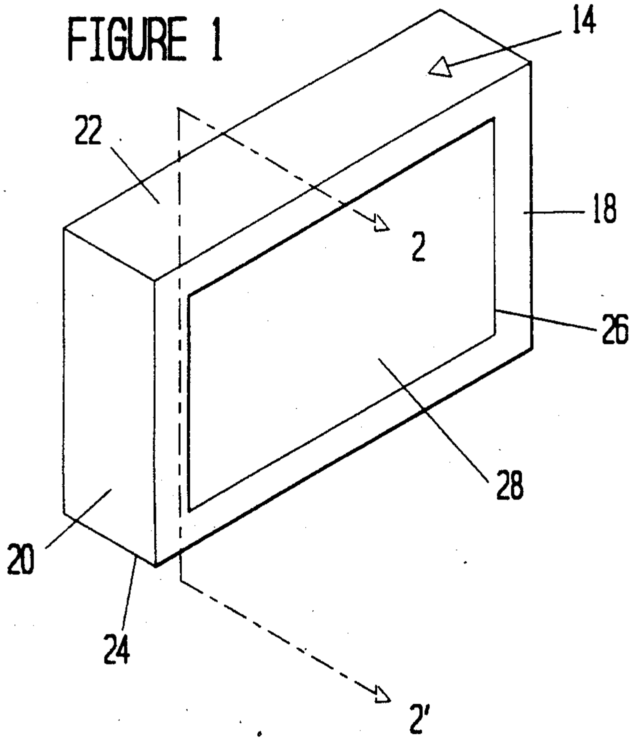
FIGURE 2
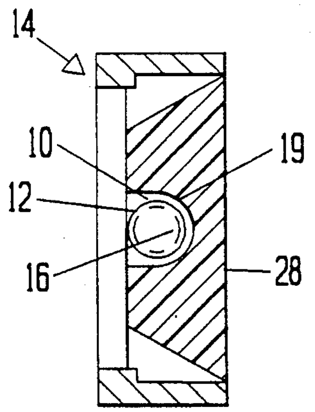
FIGURE 7
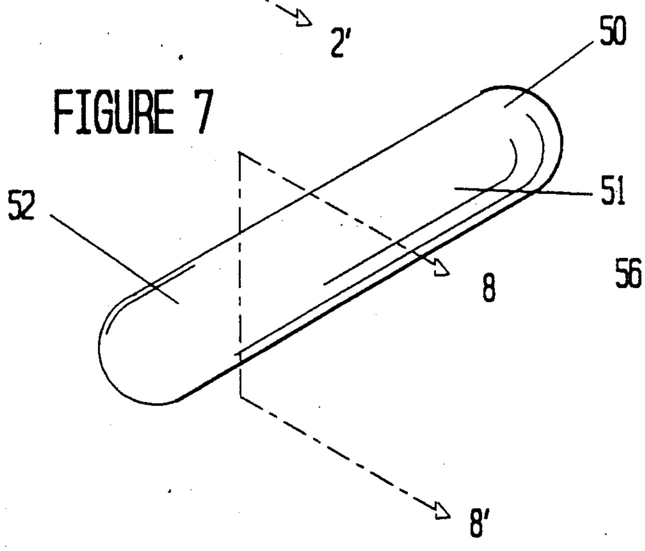
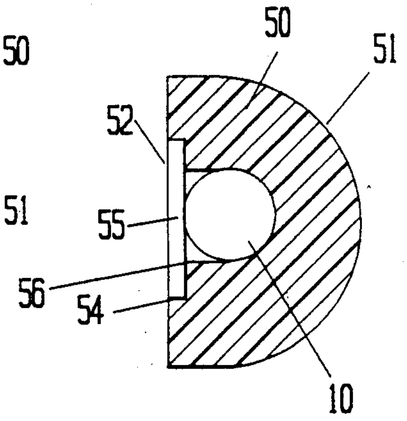
FIGURE 8

FIGURE 3
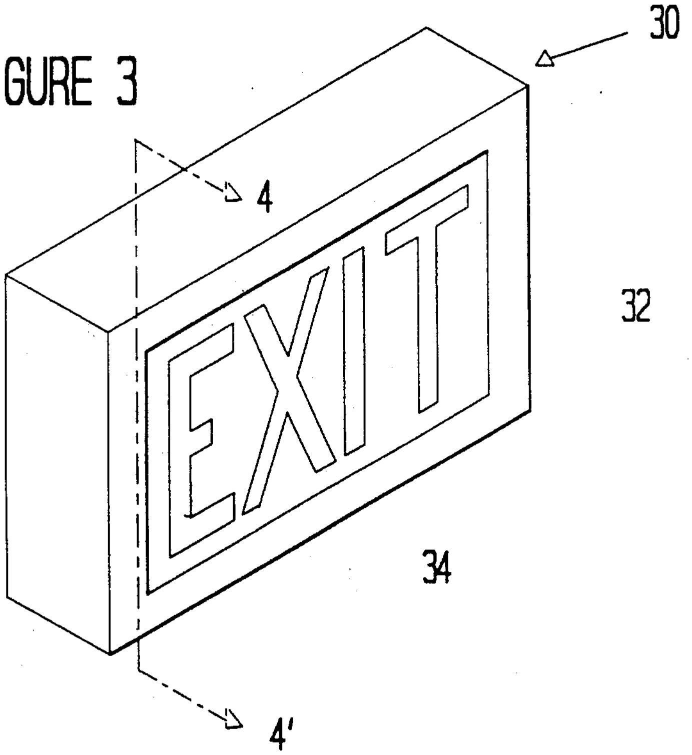
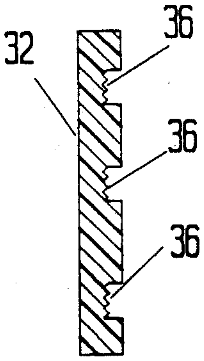
FIGURE 4
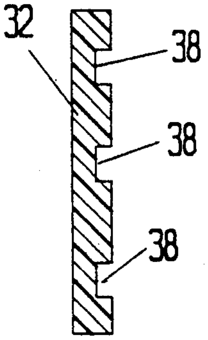
FIGURE 5
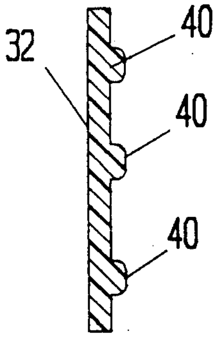
FIGURE 6

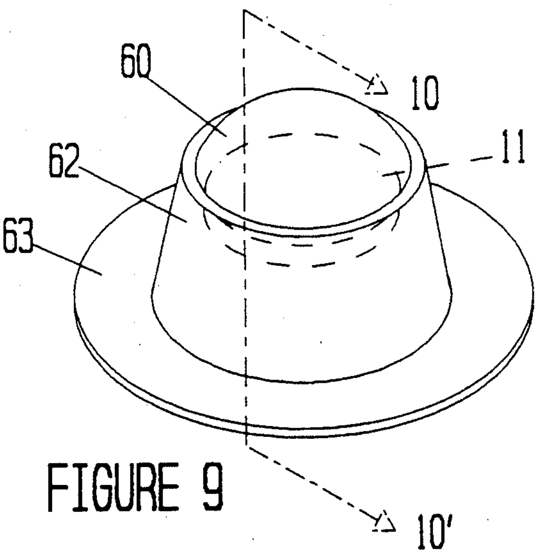
FIGURE 9
FIGURE 10
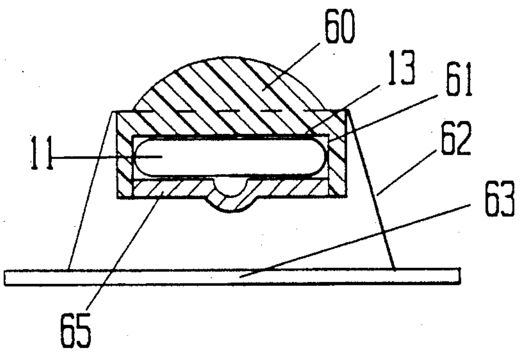
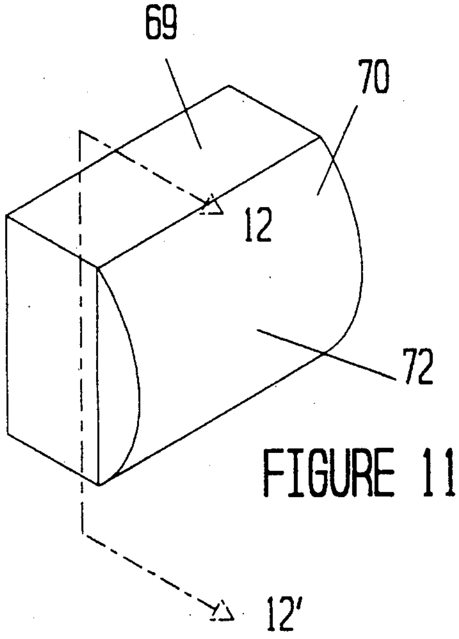
FIGURE 11
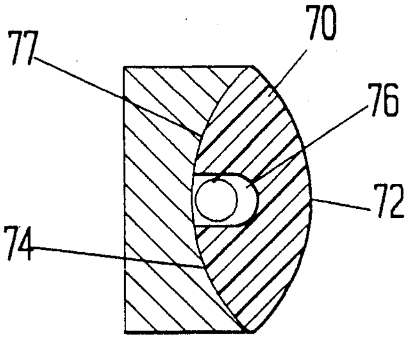
FIGURE 12

SELF-LUMINOUS LIGHT SOURCE

BACKGROUND OF THE INVENTION

1. Field of Invention

This invention relates to non-electrical light sources and, in particular, to self-luminous signs and safety markers.

2. Brief Statement of the Prior Art

Tritium gas has been used for many years in the manufacture of self-luminous signs and safety markers, as well as in instrument panels and other military applications. Tritium gas is an unstable isotope of hydrogen and emits an electron upon decay of the atomic nucleus, thus producing low level beta radiation. The beta radiation has been used to excite certain phosphors which transform the radiated energy into photons of light. The current state of the art consists in sealing the tritium gas inside a glass capsule which has been coated on its interior surface with a suitable phosphor which emits photons of visible light. Since tritium has a "half life" of approximately 12½ years, a tritium "lamp" may produce useful light in some cases for as much as 20 years.

Tritium lamps are available in several different configurations and sizes. They may be obtained in tubular form with a round cross-section or tubular form with a square or rectangular cross-section or in the form of a hollow disc or as a globe. These various shapes and sizes are used in a wide variety of signs and safety markers, all of which utilize at least one surface of their outer enclosure as the light-emitting surface.

Commercial quantities of tritium gas is available primarily as a by-product of nuclear powered generators. As a radioactive substance it is tightly controlled and regulated by government agencies, and is of course expensive. Any increase in the efficacy of its use is desirable from an economic standpoint and also as a means of conserving the available supply of a very limited commodity. Current state of the art usage of tritium lamps as safety signs and markers requires that the "lamp" be encased in a high-impact plastic housing to insure the integrity of the glass "lamp". While the glass surface of the lamp itself emits a uniform glow, the surface of the plastic housing usually does not, and when viewed from certain angles, appears to have uneven surface brightness. A uniform and increased surface brightness is desirable for both aesthetic and practical reasons. The aesthetic reason is obvious. The practical reason is to increase the usable angle of vision.

Recent improvements have been made in light collecting plastics by incorporating a fluorescent dye in transparent plastics such as polycarbonates and poly methyl methacrylates. These plastics absorb incident radiation in the ultraviolet and violet end of the visible light band of the electromagnetic spectrum, and fluoresce at a characteristic wavelength of the dye which has been incorporated within the plastic. The combined properties of internal reflection and fluorescence have been recognized to provide advantages for use of these plastics for advertising displays, decorative purposes, and solar panels.

OBJECTIVES OF THE INVENTION

It is an objective of this invention to provide a self-luminous light source which utilizes a beta emitter as the energy source.

It is a further objective of this invention to provide a self-luminous light source utilizing tritium gas with an enclosure that maximizes the degree of illumination from the tritium gas.

It is a further objective of this invention to provide a light source in which the beta emitter such as tritium gas is protected with a double walled enclosure.

It is a further objective of this invention to provide a self-luminous sign or marker utilizing tritium gas as the energy source.

It is also an objective to provide a structure which evenly diffuses the illumination from a tritium-powered light source and which provides uniform surface brightness across the face of the sign or marker.

Other and related objectives will be apparent from the following description of the invention.

BRIEF DESCRIPTION OF THE INVENTION

This invention comprises a means of increasing the efficacy of a self-luminous source of light preferably as applied to illuminated signs and safety markers. The invention utilizes a beta emitter, preferably tritium gas, which is contained within a sealed glass enclosure having an interior coating of a phosphor. The glass enclosure is contained within an outer enclosure formed of a plastic filled with a fluorescent dye. The phosphor coating on the glass enclosure of the tritium gas absorbs beta radiation from the tritium and emits radiation in a wavelength which excites the fluorescent dye in the plastic outer enclosure. This is preferably a wavelength of approximately 360 nanometers (NM), although phosphors which emit radiation of other wavelengths can also be used with some fluorescent dyes.

The sealed ampoule is contained within an outer enclosure, which is formed, at least in part, of a transparent or translucent plastic that is filled with a fluorescent dye. The fluorescent dye is selected to have light absorption properties in the wave lengths emitted by the phosphor and, as characteristic of fluorescent dyes, emits illumination of a longer wave length.

The transparent or translucent part of the outer enclosure forms the light-emitting surface and can be described as a lens or diffuser. The other part or parts of the outer enclosure are the chassis or lamp-cradle or, in some cases, would also serve as the reflector.

The invention provides advantages in the intensity and uniformity of illumination from the self-luminous tritium gas light source. Because the fluorescent dye has the property of emitting a greater amount of illumination than the incident illumination, it effectively multiplies or amplifies the intensity of the illumination. Furthermore, the plastic lens or diffuser has the property of internal light reflection so that it serves as a highly efficient collector or absorber of incident radiation from the tritium phosphor source. This ensures that substantially all of the incident radiation absorbed by the lens or diffuser is converted into excitation energy for the fluorescent dye, thus providing a conversion efficiency of nearly 100 percent. Additionally, the fluorescing plastic provides a very even or uniform illumination from the light source, avoiding gradations in intensity such as is now characteristic of the tritium illuminated signs and markers. Since the fluorescing plastic materials are so highly efficient in conversion of incident radiation, the invention provides a structure that achieves maximum illumination for the amount of tritium gas, thus providing both safety and greater efficiency in the use of this material. The result is increased surface brightness of the light source with uniform distribution of light across its face.

BRIEF DESCRIPTION OF THE DRAWINGS

The invention will be described with reference to the Figures of which:

FIG. 1 is a perspective view of a sign or marker of the invention;

FIG. 2 is a sectional elevational view along lines 2—2' of FIG. 1;

FIG. 3 illustrates a self-luminous sign according to the invention;

FIG. 4 is a sectional elevational view along lines 4—4' of FIG. 3;

FIGS. 5 and 6 illustrate embodiments alternative to that shown in FIG. 4;

FIG. 7 is a perspective view of a marker of the invention;

FIG. 8 is a sectional view along lines 8—8' of FIG. 7;

FIG. 9 is a perspective view of an alternative marker of the invention;

FIG. 10 is a sectional view along line 10—10' of FIG. 9;

FIG. 11 is a perspective view of another embodiment of the invention; and

FIG. 12 is a sectional view along line 12—12' of FIG. 11.

DESCRIPTION OF PREFERRED EMBODIMENT

The invention comprises a remote light source and, in particular, a self-luminous sign or marker for use in non-electrical installations. FIGS. 1 and 2 illustrate an assembly of the operative elements of the invention. The sign or marker is shown in perspective view in FIG. 1, and comprises an outer enclosure 14 which has side walls 18 and 20, a top wall 22 and a bottom wall 24 with at least one transparent window 26 located in one of the walls. The window 26 is filled with a lens or diffuser 28 of transparent plastic, preferably of optical quality. Examples of suitable and preferred plastics include polycarbonates, poly (methylmethacrylate) as well as mixtures of these two resins. Other transparent plastics could, however, also be used in the invention. The side walls and bottom could also be formed from the same plastic as used in the above described light emitting surface. As shown in FIG. 2, which is a sectional view of FIG. 1, the lens or diffuser 28 at least partially fills the interior of the enclosure 14, and has a trough 19 that receives the light source 10.

The plastic lens or diffuser 28 also contains a fluorescent dye. Preferably, the fluorescent dye is incorporated into the resin and is thus molded into the plastic. Alternatively, the fluorescent dye could be coated on one or both planar surfaces of the plastic lens or diffuser 28. The latter technique is not preferred as the uniform mixture of the fluorescent dye throughout the resin provides a greater efficiency in utilization of the incident radiation.

The light source 10 utilizes a beta emitter as the energy source. While various beta emitters are useful in the invention, it is preferred to use a tritium gas light source. The tritium light source conventionally comprises a sealed enclosure such as a glass ampoule 12 which contains tritium gas. The glass ampoule 12 also contains a phosphor, which has the property of absorbing beta radiation and emitting light in the visible part of the radiation spectrum. The phosphors of the tritium lamp used in the invention are selected to produce a wavelength in the ultraviolet or near-ultraviolet, or mostly an invisible portion of the electromagnetic spectrum. A preferred wavelength would be approximately 360 nanometers, although other wavelengths might be required for different fluorescing materials which are present or available in the fluorescent-dye filled plastics, previously mentioned.

Preferably, the tritium and phosphor are contained in a conventional structure in which the tritium is contained in a sealed glass ampoule having an internal coating of the selected phosphor.

As previously mentioned, emission of beta rays from the tritium gas activates the phosphor internal coating 16 of the glass ampoule 12 causing the phosphor to emit radiation in the aforementioned wave length. This radiation is incident on the inside surface of the plastic lens or diffuser 28 covering window 26. The incident radiation is refracted into the plastic lens or diffuser 28 and, with the characteristic internal reflection of the plastic is thus captured within the plastic provided that its angle of internal reflection is greater than the critical reflection angle.

The fluorescent dye which is intimately mixed throughout the resin, and the internal reflection of the incident radiation within the plastic sheet, ensures almost complete utilization of the incident radiation and conversion of that radiation to the fluorescent radiation characteristic of the dye.

Various fluorescent dyes can be used for the invention. The plastic sheets of optical quality which have fluorescent dyes incorporated in them and the dyes having absorption capability in the ultra-violet and near ultra-violet wave length, e.g., from 100 to about 600 nanometers, comprise commercially available products which are available under the trade designation LISA from Mobay Corporation, c/o Bayer AG, D-5090 Leverkusen, Geschaftsbereich Kunstostoffe, West Germany.

When the light source is to be used in a sign or safety marker, a structure similar to that shown in FIG. 3 is used. In this sign 30, the window panel 32 which is to emit visible light may be coated or treated in the areas which form the letters 34 to change the effective angle of the interface between the exterior surface of the panel 32 and the surrounding air, and thus eliminate total internal reflection. As shown in FIG. 4, the area to emit light can be treated by machining to cut grooves 36 in the surface and thereby form letters such as the "EXIT" letters 34 that appear in FIG. 3. Alternatively, the surface could be molded or carved with the incised letters 38 of FIG. 5 or could be molded with raised letters 40 such as shown in FIG. 6 which are also effective in changing the internal reflection angle so that it is greater than the critical angle and thus permit light emission from the chosen areas. The plastic part may also be sand blasted or treated with other methods to achieve a similar effect.

The sign or marker can be of widely varied form and size, as required or desirable for a particular installation. FIGS. 7 and 8 illustrate a suitable cylindrical shape as used for a self-luminous marker. In this structure, the outer enclosure comprises an elongated bar 50 of the fluorescent-dye filled plastic, which has a cylindrical outer surface 51 and a flat base 52. The base has a groove 54 which receives a cover plate 55 and which opens into a trough 56. The light source 10 is placed in trough 56 and the cover plate 55 can be sealed in groove 54. The cylindrical outer surface 51 of the plastic functions as a cylindrical diffusing lens for the light emitted by the fluorescent dye within the plastic.

As shown in FIGS. 9 and 10, the marker can be circular, with a lens 60 which is the light emitting surface and which is formed of the fluorescent filled plastic. The lens is received over a cylindrical housing 62 having a circular flange base 63. The light source 11 can be a circular glass vial 13 (see FIG. 10) which contains the tritium: gas and an internal phosphor coating. This vial 13 is received in a circular recess 61 on the inside surface of the plastic lens 60. The recess 61 can be closed and sealed with a bottom plate 65.

FIGS. 13 and 14 illustrate an alternative embodiment of the marker, in which the marker housing is a generally rectangular box that is covered with a lens 70. The lens is formed of the aforementioned fluorescent-dye filled plastic. The lens has arcuate outer and inner walls 72 and 74, and a trough 76 along its inner wall 74. The housing can have a wall 77 with a contour that mates the contour of the inner wall 74 of the lens 70 and can be covered with a light reflecting surface. The light source 10 is the aforementioned glass vial filled with tritium gas and internally coated with a selected phosphor. The vial is placed within trough 76 and the entire assembly can be sealed, e.g., by bonding the mating walls 74 and 77.

As previously mentioned, because of its total internal reflection characteristic, the plastic which forms the light-emitting surface is substantially 100 percent effective in conversion of the incident radiation to illumination characteristic of the fluorescent dye.

The invention has been described with reference to the illustrated and presently preferred embodiment. It is not intended that the invention be unduly limited by this disclosure of the presently preferred embodiment. Instead, it is intended that the invention be defined, by the means, and their obvious equivalents, set forth in the following claims:

What is claimed is:

1. An illumination source remote from electrical or combustible energy sources which comprises:

(a) a beta-emitter to radiate beta particles and contained within a sealed enclosure;

(b) a phosphor that absorbs beta radiation and emits radiation of a wave length from about 100 to 600 nanometers within invisible light spectrum located in a position within said illumination source to receive radiation of beta particles from said beta-emitter.

(c) a light emitting surface located at a position to receive said radiation emitted by said phosphor, and formed of a plastic filled with a fluorescent dye having an excitation wavelength from about 100 to 600 nanometers and an emission wavelength within the visible light spectrum.

2. The illumination source of claim 1 wherein said beta-emitter is tritium gas.

3. The illumination source of claim 2 wherein said phosphor comprises a coating on the inside walls of said sealed enclosure.

4. The illumination source of claim 3 wherein said sealed enclosure is a glass vial.

5. The illumination source of claim 4 including a housing having walls defining an interior chamber to receive said glass vial with an opening in a wall thereof and with said optical-quality plastic covering said window.

6. The illumination source of claim 1 wherein said phosphor emits radiation with a wavelength of approximately 360 nanometers.

7. The illumination source of claim 1 wherein said beta-emitter is tritium gas.

8. The illumination source of claim 7 wherein said phosphor comprises a coating on the inside walls of said sealed enclosure.

9. The illumination source of claim 8 wherein said sealed enclosure is a glass vial.

10. The illumination source of claim 9 including a housing having walls defining an interior chamber to receive said glass vial with an opening in a wall thereof and with said optical quality plastic covering said window.

11. In a remote self-luminous sign or marker which contains a light source comprising a ampoule with its internal walls coated with a phosphor and containing tritium within an outer enclosure having a light emitting window, the improvement resulting in enhanced brightness and uniformity of light emitted therefrom which comprises: (1) providing as said light emitting window a diffuser formed of plastic filled with a fluorescent dye having an excitation wavelength from 100 to 600 nanometers and an emission wavelength within the visible light spectrum; and (2) selecting said phosphor coating of said light source to emit radiation within said wavelength.

12. The illumination source of claim 6 wherein said ampoule is a sealed glass vial.

13. The illumination source of claim 7 including a housing having walls defining an interior chamber to receive said glass vial with an opening in a wall thereof and with said optical-quality plastic covering said window.

14. In a remote self-luminous sign or marker which contains a light source comprising a ampoule with its internal walls coated with a phosphor and containing tritium within an outer enclosure having a light emitting window, the improvement resulting in enhanced brightness and uniformity of light emitted therefrom which comprises: (1) providing as said light emitting window a diffuser formed of plastic filled with a fluorescent dye having an excitation wavelength from about 100 to 600 nanometers and an emission wavelength within the visible light spectrum; and (2) selecting said phosphor coating of said light source to emit radiation within said wavelength and within the invisible portion of the electromagnetic spectrum.

15. The illumination source of claim 14 wherein said phosphor emits radiation with a wavelength of approximately 360 nanometers.

16. The illumination source of claim 14 wherein said ampoule is a sealed glass vial.

17. The illumination source of claim 16 including a housing having walls defining an interior chamber to receive said glass vial with an opening in a wall thereof and with said optical-quality plastic covering said window.

* * * * *

UNITED STATES PATENT AND TRADEMARK OFFICE

CERTIFICATE OF CORRECTION

PATENT NO. : 4,990,804

DATED : February 5, 1991

INVENTOR(S) : Rhett McNair

It is certified that error appears in the above-identified patent and that said Letters Patent is hereby corrected as shown below:

ON THE TITLE PAGE:

Name of Inventor: delete "Rhett C. McNair" and insert therefor --Rhett McNair--

Address of Inventor: delete "4081 G E. LaPalma, Anaheim, CA 92807" and insert therefor --Route 13, Box 398, Lake City, Florida 32055 --

Signed and Sealed this

Thirteenth Day of October, 1992

*Attest:*

DOUGLAS B. COMER

*Attesting Officer* *Acting Commissioner of Patents and Trademarks*